(12) United States Patent
Kaspi

(10) Patent No.: US 6,553,045 B2
(45) Date of Patent: Apr. 22, 2003

(54) MULTIPLE WAVELENGTH BROAD BANDWIDTH OPTICALLY PUMPED SEMICONDUCTOR LASER

(75) Inventor: Ron Kaspi, Albuquerque, NM (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 09/682,450

(22) Filed: Sep. 4, 2001

(65) Prior Publication Data
US 2003/0043877 A1 Mar. 6, 2003

(51) Int. Cl.$^7$ ................................................. H01S 5/04
(52) U.S. Cl. ........................................... 372/43; 372/23
(58) Field of Search ........................................ 372/43, 23

(56) References Cited

U.S. PATENT DOCUMENTS 5,212,706 A * 5/1993 Jain ............................. 372/50
5,708,672 A * 1/1998 Pessot et al. .................. 372/23

* cited by examiner

Primary Examiner—James Davie
(74) Attorney, Agent, or Firm—James M. Skorich; Kenneth E. Callahan

(57) ABSTRACT

An optically pumped semiconductor laser with the active region partitioned such that different wavelengths can be emitted simultaneously from each partitioned region. The material of the partitioning layers is selected to be transparent to the pump wavelength, an electronic barrier to carrier diffusion, and epitaxially compatible with subsequent layers of the laser structure.

7 Claims, 4 Drawing Sheets

| Layer | Thickness (nm) | Function | |
|---|---|---|---|
| GaSb | 20 | Cap Layer | |
| $Al_{0.9}Ga_{0.1}As_{0.09}Sb_{0.91}$ | 2000 | Top Clad Layer | |
| $In_{0.2}Ga_{0.8}As_{0.18}Sb_{0.91}$ | 100 | Integrated Absorber | |
| InAs | 1.9 | Electron Well | |
| $In_{0.25}Ga_{0.75}Sb$ | 2.4 | Hole Well | x3 |
| InAs | 1.9 | Electron Well | |
| $In_{0.2}Ga_{0.8}As_{0.18}Sb_{0.91}$ | 100 | Integrated Absorber | |
| $Al_{0.9}Ga_{0.1}As_{0.09}Sb_{0.91}$ | 200 | Optically Transparent Electrical Barrier | |
| $In_{0.2}Ga_{0.8}As_{0.18}Sb_{0.91}$ | 100 | Integrated Absorber | |
| InAs | 2.1 | Electron Well | |
| $In_{0.25}Ga_{0.75}Sb$ | 2.4 | Hole Well | x3 |
| InAs | 2.1 | Electron Well | |
| $In_{0.2}Ga_{0.8}As_{0.18}Sb_{0.91}$ | 100 | Integrated Absorber | |
| $Al_{0.9}Ga_{0.1}As_{0.09}Sb_{0.91}$ | 2000 | Bottom Clad Layer | |
| GaSb | | Substrate | |

FIG. 5

MULTIPLE WAVELENGTH BROAD BANDWIDTH OPTICALLY PUMPED SEMICONDUCTOR LASER

FEDERAL RESEARCH STATEMENT

The conditions under which this invention was made are such as to entitle the Government of the United States under paragraph I(a) of Executive Order 10096, as represented by the Secretary of the Air Force, to the entire right, title and interest therein, including foreign rights.

BACKGROUND OF INVENTION

This invention relates generally to semiconductor light sources, and, more particularly to multiple wavelength, broadly tunable optically pumped semiconductor diodes and lasers.

In a standard semiconductor laser or a light emitting diode, recombination between electrons in the conduction band and holes in the valence band produces photons that are emitted. The wavelength of the emitted photons is determined by the transition energy between the two states. The active region of the device, where the recombination takes place, can be either relatively thick, or of quantum dimensions (e.g., a quantum well) in order to facilitate this process. The energy of the transition can be modified either by changing the composition of the material in thick active-layers, or by changing either the thickness or composition of the quantum wells. FIG. 1 gives a schematic example of a quantum well laser in which the two fundamental levels within the quantum well located inside the cavity of the laser (indicated by $E_1$ and $HH_1$) determine the emission wavelength.

However, if two or more quantum wells emitting at different wavelengths are placed in the cavity of a standard semiconductor diode laser (FIG. 2), the laser will not emit at more than one wavelength simultaneously. In fact, competition between the different wells will occur, one will prevail, and the device will emit solely at the wavelength of that well. The reasons for this are well known. Briefly, as the injection current is increased, wells begin to fill with carriers but the laser threshold is first crossed for only one of these wells. Once this happens, the device is in laser operation mode with stimulated emission. Stimulated emission redirects the totality of the injected carriers (electrons and holes) to the lasing well at which they are promptly consumed. The Fermi level (a measure of carrier density) is therefore blocked and no longer increases when the injection current is increased. The other wells consequently cannot further increase their carrier density and will not reach their lasing threshold.

A less common type of semiconductor laser is one where carriers are generated by optical pumping, rather than electrical injection. These lasers are referred to as optically pumped semiconductor lasers (OPSL"s). In this case, the pump light is absorbed within the semiconductor structure and generates carriers, which in-turn diffuse toward the active layers (thick or quantum-sized) where they recombine to emit photons at a different wavelength. Despite the different method of generating carriers as compared to the standard diode laser, the carriers distribute themselves in a similar manner. In the case of multiple quantum wells emitting light at different wavelengths, one quantum well will prevail and disallow the others from reaching a lasing threshold.

Techniques that are external to the laser device, such as an external cavity with a grating, can force a laser to emit at a particular wavelength. These external techniques can therefore be used to select the emission wavelength of a laser from the range of wavelengths that the active regions are capable of producing (i.e., its bandwidth). Semiconductor lasers containing multiple wells in the same laser cavity have been successful in producing lasers with en extended bandwidth. However, simultaneous emission of more than one wavelength from the same cavity of a semiconductor laser has not been accomplished using either a standard diode design or an optically pumped design.

Inter-subband quantum cascade lasers (QCL's), which appeared in 1994, are not considered to be standard semiconductor diode lasers, They are capable of producing lasers that emit at more than one wavelength. They differ from standard lasers in that the emission of a photon occurs as a result of transitions within only one band and therefore involves only one type of carrier. There is no disappearance of carriers during the emission of a photon as is the case with standard lasers (see U.S. Pat. No. 6,091,751). The same electron may furthermore be used several times in several quantum wells in crossing the structure, and may thus emit several photons. In its path crossing the structure, the electron can be forced to undergo transitions that are not all equivalent in energy. Because stimulated emission at one wavelength does not preclude reaching stimulated emission at another wavelength, two or more wavelengths can, in principle, be emitted simultaneously from such lasers. Moreover, QCL's also allow the population of additional electronic levels within the conduction band to produce simultaneous lasing emission at more than one wavelength. The drawback of manufacturing multi-wavelength lasers using QCL's include the fact that the different wavelengths tend to be closely separated, not independently engineered, and require highly complicated epitaxial structures.

Accordingly, there is a need for an OPSL that can simultaneously lase at a plurality of wavelengths from the same cavity or emit within a broadly tunable wavelength range.

SUMMARY OF INVENTION

In a preferred embodiment, an optically pumped semiconductor laser capable of simultaneously emitting a plurality of wavelengths is disclosed. The pump wavelength absorbing region is subdivided into n+1 regions by n partition layers. The partition layers are composed of a material that is transparent to the pump wavelength, but an electronic barrier to carrier diffusion and epitaxially compatible with other layers of the semiconductor laser structure. One or more essentially identical quantum well structures are located within each subdivided region of the absorbing region. The quantum well structures of at least one the subdivided regions is fabricated to emit at a different wavelength than any other subdivided region, so that two or more wavelengths may be simultaneously emitted. The number of essentially identical quantum wells within a given subdivided region can be varied to vary the relative intensity of its emitted wavelength. Or, the relative intensity of the emitted wavelengths can be varied by increasing or decreasing the volume of the absorbing medium by the positioning of the partition layers.

Other aspects and advantages of the present invention will become apparent from the following detailed description, taken in conjunction with the accompanying drawing, illustrating by way of example the principles of the invention.

BRIEF DESCRIPTION OF DRAWINGS

FIG. 5 shows the layers of a representative semiconductor laser with quantum wells partitioned into two regions.

DETAILED DESCRIPTION

In optically pumped semiconductor lasers (OPSLs), carriers are created in layers within the laser structure that absorb the pump light. In some OPSL designs, layers that have the specific function of absorbing the pump light surround the active layers. In this way, carriers that are created can easily transfer into the active regions, such as quantum wells, so that light can be re-emitted at a new wavelength. The portion of the pump light that can be absorbed depends on the thickness of the absorbing medium and the absorption coefficient of that medium. Typically, 100"s of nanometers of the medium are required to absorb more than 90% of the pump light. Therefore, several quantum wells can be separated by absorbing layers that only partially absorb the pump light so that each well has good access to carriers that are generated around it. The diffusion process, however, allows the redistribution of carriers in a way that impedes simultaneous lasing at two different wavelengths, as previously described. The present invention is a method of partitioning the absorbing medium in such a way that carriers generated within specific regions of the absorbing medium cannot diffuse into adjacent regions.

In the simplest case, a single semiconductor layer is inserted to partition the absorbing medium into two regions. This partitioning layer has three necessary properties. The first of these is transparency to the pump wavelength. This requirement allows carriers to be generated at both sides of the partitioning layer. Another requirement is that the partitioning layer constitutes an electronic barrier to carrier diffusion. This prevents carriers that are photo-generated in either side to cross over by diffusion. The third property is that it allows adequate epitaxial growth of the subsequent portion of the semiconductor laser structure.

Figure 1:
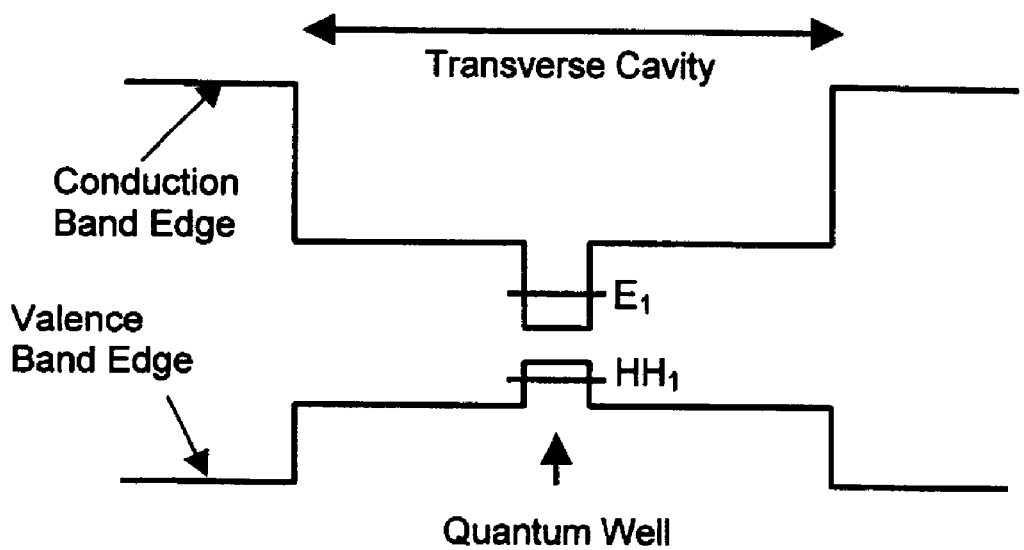
FIG. 1 is a flatband schematic of the conduction band edge and the valence band edge in a semiconductor laser containing a quantum well. The fundamental optical transition is between the lowest energy electron level ($E_1$), and the lowest energy hole level ($HH_1$).
Figure 2:
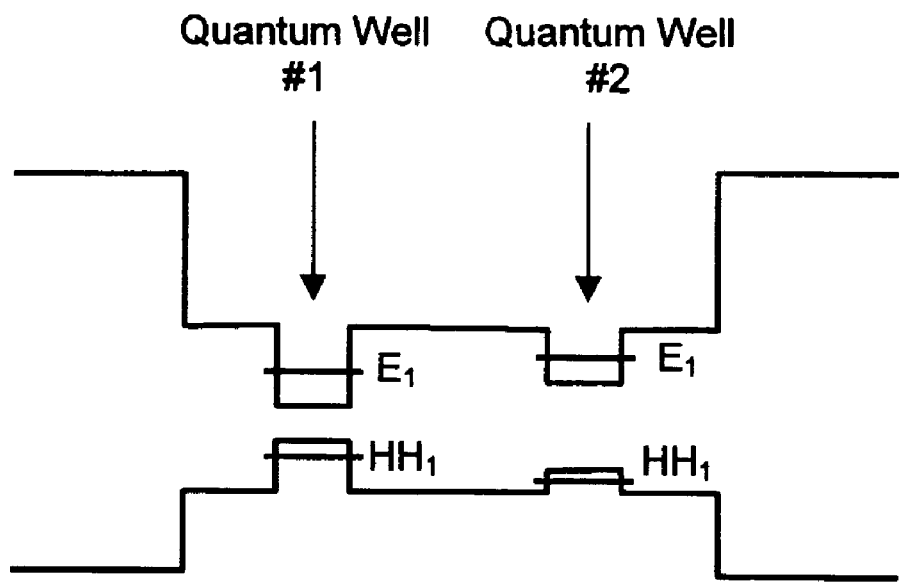
FIG. 2 is a flatband schematic of a laser in which two different quantum wells are inserted into the cavity.
Figure 3:
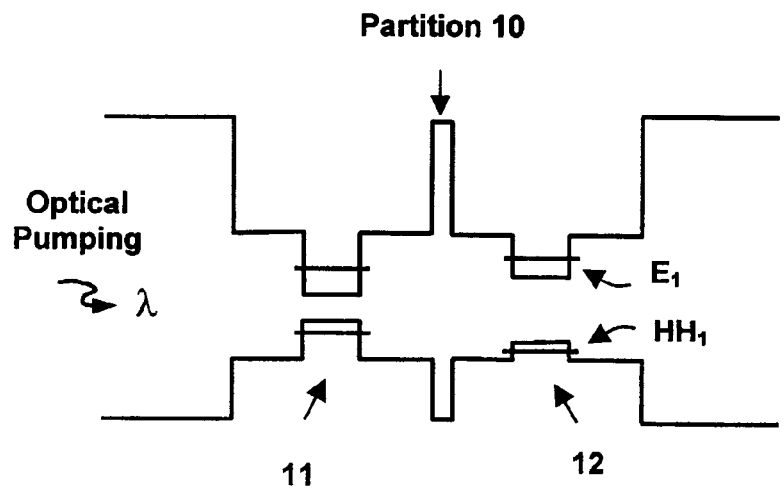
FIG. 3 is a flatband schematic of optically pumped laser in which the absorbing region is partitioned into two by an optically transparent electrical barrier layer. A different quantum well resides in each partitioned region.

Once the absorbing medium is partitioned in the manner described above, each partitioned region can then accommodate an active region such as a quantum well. In the simplest case of partitioning into two regions, two quantum wells can be accommodated Each quantum well is fabricated to produce a desired emission wavelength. This situation is depicted in FIG. 3 in which the partition 10 has the previously described characteristics. The partition is transparent to the optical pumping wavelength λ but is an electronic barrier to carrier diffusion. Each quantum well 11, 12 can consequently lase at its designed wavelength simultaneously.

As the pump power is increased, more and more carriers are generated at each of the partitioned regions surrounding the wells. When one of these wells 12 reaches a threshold for stimulated emission, it is unable to deplete carriers from the second well 11 by the diffusion process. Subsequent increases in pump power continue to increase the carrier density in the second well, until it also reaches a threshold for stimulated emission. In this scenario, a single laser can simultaneously emit at two different wavelengths from the same cavity. The partitioning of the absorbing medium into n regions could result in as many as n different wavelengths. And, a plurality of quantum wells designed for a desired wavelength could be fabricated within each partitioned region.

The relative strength of emission of the two (or more) wavelengths can be adjusted by making simple design changes in the optically pumped laser. The number of essentially identical quantum wells in a given partitioned region can be increased relative to the number of quantum wells in other partitioned regions to increase the strength of emission at its designed wavelength. Or, if the absorbing medium is partitioned in such a way that one partitioned region has a larger volume of absorbing medium, than the wells within that partition region will be better populated, increasing the strength of emission.

The invention also allows a wide wavelength range of external tunability to be engineered into the optically pumped laser. In this case, the partitioning of the absorbing medium allows a more equitable distribution of carriers into the set of slightly different quantum wells extending the gain bandwidth of the laser. External means can be used to select a particular lasing wavelength within a much larger range, thus enhancing the tunability of such a laser.

There are three basic ways to force a laser to emit at a particular wavelength within its emission band. One of these is to set up an external cavity around the laser containing a dispersive element such as a grating. This will allow only a particular wavelength to survive in the cavity. This wavelength can be adjusted with the angle of the grating. A second scheme involves a grating to be etched onto the crystal of the laser itself. A distributed feedback (DFB) laser is one such example. In this case the lasing wavelength is determined by the dimensions of the grating, and becomes fixed once the grating is etched. The third scheme involves a second laser (master oscillator) whose emission wavelength induces the first laser to emit at that wavelength (slave laser). All three schemes can in principle determine the wavelength of emission by changing something other than the original epitaxial structure of the laser.

Each of the external schemes described above is only capable of selecting a wavelength that is within the gain bandwidth that is the range of available wavelengths. The partitioning, as disclosed here, can be used to broaden this available bandwidth. For example, a laser with a series of partitions, each containing a different active (photon producing) region will result in a structure that is capable of producing gain within a broader wavelength range than a laser without such a partition.

Figure 6:
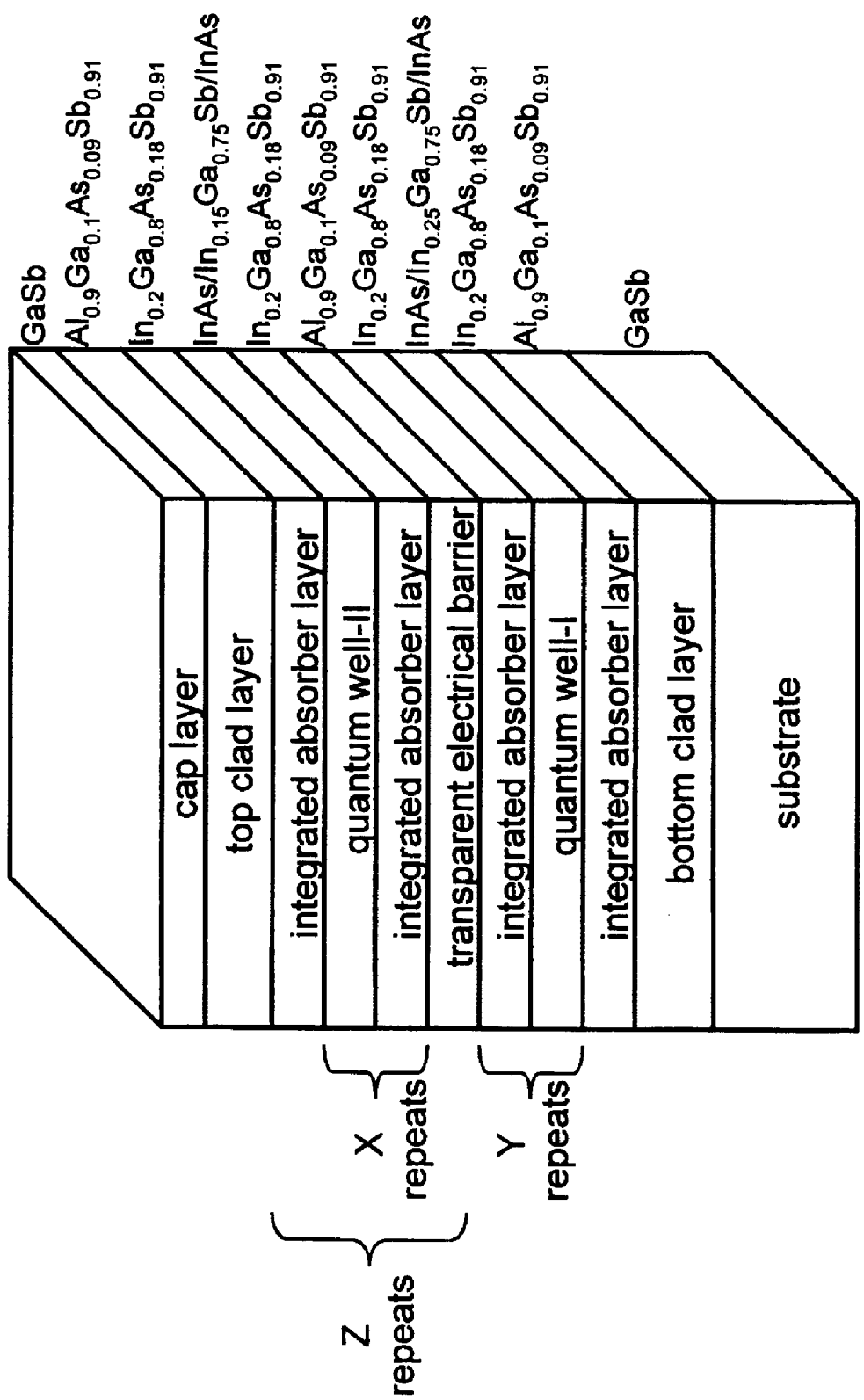
FIG. 6 shows a three-dimensional cross-section of a representative semiconductor laser with quantum wells partitioned into two regions.

As an example of the present invention, an optically pumped semiconductor laser was grown on commercially available GaSb substrate wafers. The molecular beam epitaxy (MBE) technique was used to epitaxially deposit the various semiconductor layers in the design. The layers, their thickness, and their function are detailed in FIGS. 5 and 6.

The optical waveguide (clad) layers were AlGaAsSb alloys with an approximate thickness of 2 micrometers each. These clad compositions were nearly lattice-matched to the GaSb substrate so that relatively thick layers could be deposited without a large buildup of elastic strain. The bandgap of these clad layers was much larger in energy than the energy of the photons emitted by the optical pump source allowing the approximate 1.85 micrometer wavelength emission of the pump source to go through unimpeded.

Within the top and bottom clad layers was a region of absorber material composed of an InGaAsSb alloy encompassing quantum wells. The absorber material was also of an alloy composition where the lattice-constant was nearly matched to that of the GaSb substrate. The bandgap of this alloy, however, was smaller in energy than that of the photons emitted by the pump source. Carriers were therefore created within this absorbing medium.

This InGaAsSb alloy absorbing medium was split into two regions with the insertion of partition layer composed of an approximately 200-nanometer thick layer of material of the same composition as the clad layers (AlGaAsSb alloys). While this layer allowed the pump emission to go through, its relative band alignment with the adjacent absorber layers prevented diffusion of carriers across it.

Within each of the two absorbing regions, three type-II quantum wells (each containing a InAs/InGaSb/lnAs sequence) were inserted. Each of the three wells was separated by approximately 100 nanometers of absorber material (InGaAsSb alloy). One set of three wells was designed to emit photons with slightly larger energy than the other set of wells.

The substrate of the semiconductor laser structure was mechanically thinned down to approximately 150 micrometers before being cleaved to a dimension of approximately 7 mm by 2 mm, where 2 mm is the distance between the front and back facet of the device. The sample was then soldered with indium onto a copper mount and cooled to the desired temperature in a cryogenic Dewar.

Figure 4:
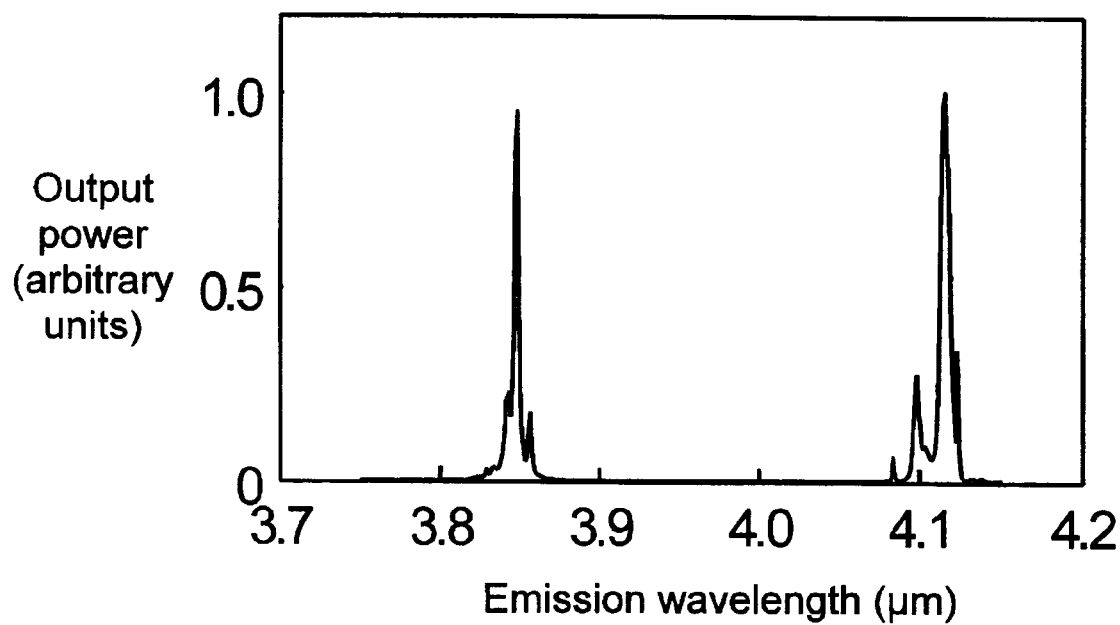
FIG. 4 is a plot of spectral data from an optically pumped 2-color laser showing simultaneous lasing emission at approximately 3.85 micron and 4.12 micron wavelengths.

A 1.85-micrometer wavelength laser diode array was used to optically pump the device. The pump emission was focused onto the laser chip in a stripe that was approximately 150 micrometers wide. A power meter was used to collect the laser output power at various temperatures. This device demonstrated the simultaneous emission of two different wavelengths (3.84 micrometer and 4.12 micrometers) from the same cavity in an optically pumped laser. A spectral measure of the lasing wavelengths for this example is shown in FIG. 4.

Any single composition layer or multiple layers of different compositions that have a bandgap larger than the pump energy (so that it's transparent), and provide a conduction-band as well as a valence-band offset (so that neither electrons or holes can move across) will work. Specific examples will depend on the pump energy and the rest of the laser structure. If for example the optically pumped laser is designed to be pumped at 808-nm wavelength (~1.41 eV), then GaAs (bandgap ~1.5 eV) may work as the optically transparent electronic barrier, provided that it has the necessary band-offsets with the adjacent material. The third criterion of not incurring damage to the crystal is less stringent because the laser may still work with some small amount of damage. In the specific example discussed, any AlGaAsSb composition including GaSb will work because the bandgap of this alloy is always larger than our pump energy (~0.62 eV), and there will always be a barrier to diffusion for both holes and electrons. Our specific example happens to be a very close lattice-constant match to the rest of the structure, thus incurring no undue strain or damage.

The concept is equally valid if a thick active region is both absorbing the pump photons and also generating the lasing photons instead of integrated absorber layers and quantum wells. The partitioning will allow two slightly different thick active layers to reach lasing without loss of carriers from one to the other.

What is claimed is:

1. An optically pumped semiconductor laser for simultaneously emitting a plurality of wavelengths, comprised of:

a pump wavelength absorbing region having carriers subdivided into n+1 regions by n partition layers;

the partition layers being transparent to a pump wavelength, being an electronic barrier to carrier diffusion, and being epitaxially compatible with subsequent layers of the semiconductor laser structure; and one or more essentially identical quantum well structures located within each subdivided region of said absorbing region, but with the one or more quantum well structures of at least one subdivided region being different than any other subdivided region, whereby a plurality of wavelengths may be simultaneously emitted.

2. The invention of claim 1 wherein said absorbing region is an alloy of InGaAsSb.

3. The invention of claim 1 wherein said partition is an alloy of AlGaAsSb.

4. The invention of claim 1 wherein the relative emission strength of the plurality of wavelengths emitted is adjusted by varying the partition layers position such that the volume of absorbing material within a given subdivided region is greater or lesser relative to other subdivided regions.

5. The invention of claim 1 wherein the relative emission strength of the plurality of wavelengths emitted is adjusted by varying the number of quantum wells within a given subdivided region.

6. The invention of claim 1 wherein external means are used to select a particular lasing wavelength within the much larger range of wavelengths provided by the partitioned semiconductor laser.

7. An optically pumped semiconductor laser for simultaneously emitting a plurality of wavelengths, comprised of:

a pump wavelength absorbing region having carriers subdivided into n+1 regions by n partition layers;

the partition layers being transparent to a pump wavelength, being an electronic barrier to carrier diffusion, and being epitaxially compatible with subsequent layers of the semiconductor laser structure; and one or more thick active regions for absorbing pump photons and generating lasing photons, located within each subdivided region of said absorbing region, with the one or more thick active regions of at least one subdivided region being different than the one or more thick active regions of any other subdivided region, whereby a plurality of wavelengths may be simultaneously emitted.

* * * * *